US012291312B2

(12) United States Patent
Audet (10) Patent No.: US 12,291,312 B2
(45) Date of Patent: May 6, 2025

(54) SOLAR POWER GENERATORS (71) Applicant: POLYVALOR, LIMITED PARTNERSHIP, Montreal (CA)

(72) Inventor: Yves Audet, La Macaza (CA)

(73) Assignee: POLYVALOR, LIMITED PARTNERSHIP, Montreal (CA)

( * ) Notice: Subject to any disclaimer, the term of this patent is extended or adjusted under 35 U.S.C. 154(b) by 431 days.

(21) Appl. No.: 17/754,242

(22) PCT Filed: Sep. 28, 2020

(86) PCT No.: PCT/CA2020/051290
§ 371 (c)(1),
(2) Date: Mar. 28, 2022

(87) PCT Pub. No.: WO2021/062525
PCT Pub. Date: Apr. 8, 2021

(65) Prior Publication Data
US 2022/0348293 A1 Nov. 3, 2022

Related U.S. Application Data (60) Provisional application No. 62/907,986, filed on Sep. 30, 2019.

(51) Int. Cl.
B63B 22/20 (2006.01)
B63B 22/04 (2006.01)
(Continued)

(52) U.S. Cl.
CPC ............. B63B 22/20 (2013.01); B63B 22/04 (2013.01); H01L 31/042 (2013.01); H02S 20/30 (2014.12); H02S 40/44 (2014.12); H10N 10/17 (2023.02)

(58) Field of Classification Search
CPC ........ H02S 40/425; H02S 20/00; H02S 40/44; H02S 20/32; H02S 20/30; H01L 31/048; H01L 31/0547; H01L 31/0543; H01L 31/042; B63B 22/20; B63B 22/04; H10N 10/17
See application file for complete search history.

(56) References Cited

U.S. PATENT DOCUMENTS 4,786,795 A 11/1988 Kurashima et al.
2005/0028524 A1 2/2005 Laing et al.
(Continued)

FOREIGN PATENT DOCUMENTS

CN 201869120 6/2011
JP S60179811 9/1985
(Continued)

OTHER PUBLICATIONS

International Search Report, PCT/CA2020/051290, Dec. 2, 2020.

Primary Examiner — Alfred Basichas
(74) Attorney, Agent, or Firm — Norton Rose Fulbright Canada LLP (57) ABSTRACT A solar power generator has: a frame securable to an underwater ground surface; a shaft supported by the frame; a casing floatable on a body of water and movably mounted to the frame via the shaft, the casing rotatable relative to the frame about a first axis defined by the shaft; a photovoltaic cell array secured to the casing; and a motor operatively connected to the casing for rotating the casing about the first axis to orient the photovoltaic cell array towards a sun in function of an azimuth of the sun.

17 Claims, 7 Drawing Sheets (51) Int. Cl.
  *H01L 31/042*  (2014.01)
  *H02S 20/30*  (2014.01)
  *H02S 40/44*  (2014.01)
  *H10N 10/17*  (2023.01)

(56) References Cited

U.S. PATENT DOCUMENTS

2006/0260605 A1  11/2006  Connor
2009/0301547 A1  12/2009  Laing et al.
2014/0034110 A1  2/2014  Yang et al.
2014/0245941 A1  9/2014  Haider et al.
2018/0015989 A1  1/2018  Lee et al.

FOREIGN PATENT DOCUMENTS

SOLAR POWER GENERATORS

CROSS-REFERENCE TO RELATED APPLICATIONS

This application claims benefit to U.S. Provisional patent application No. 62/907,986, filed on Sep. 30, 2019, the contents of which are hereby incorporated in their entirety.

TECHNICAL FIELD

The disclosure relates generally to photovoltaic cell arrays disposed on water and, more particularly, to systems and methods used to orient such arrays relative to the sun.

BACKGROUND OF THE ART

In order to meet Paris convention objectives, many countries are turning to renewable energy to decrease carbon dioxide emissions. Hydroelectricity, wind turbine, and solar energy are examples of renewable energy. Solar panels may be an environmentally friendly alternative to fossil-based energy sources. However, the efficiency of such panels typically vary from 15 to 21%.

Therefore, improvements are sought.

SUMMARY

In accordance with a first aspect, there is provided a solar power generator comprising: a hoop securable to a ground surface underwater; a casing configured to float on a body of water and movably mounted to the hoop via a shaft, the casing rotatable relative to the hoop about a first axis defined by the shaft, the shaft and the casing pivotable about a second axis transverse to the first axis; a photovoltaic cell array secured within the casing; and a powertrain having at least one motor, the powertrain in engagement with the casing and with the hoop, the powertrain operable in a first configuration in which the at least one motor causes rotation of the casing about the first axis and in a second configuration in which the at least one motor causes rotation of the casing about the second axis.

Still in accordance with the first aspect, the casing is rotatably movable relative to the shaft, the at least one motor secured to the casing and in driving engagement with the shaft, ends of the shaft in driving engagement with the hoop and movable along the hoop, the powertrain including a braking device secured to one of the hoop and the shaft and movable between a first position in which the braking device engages the other of the hoop and the shaft to limit rotation of the shaft relative to the hoop and a second position in which the braking device is disengaged from the other of the hoop and the shaft, actuation of the at least one motor rotating the casing about the first axis in the first position and about the second axis in the second position.

Still in accordance with the first aspect, the braking device is a solenoid having a housing secured to the shaft and a rod movable relative to the housing from a retracted position in which the rod is disengaged from the hoop and an extended position in which the rod is slidably received within an aperture defined through the hoop.

Still in accordance with the first aspect, track gears are secured to the hoop, the ends of the shaft in driving engagement with gears meshed with the track gears.

Still in accordance with the first aspect, a heat sink is secured to the casing, the heat sink providing heat exchange relationship between photovoltaic cells of the photovoltaic cell array and an environment outside the casing.

Still in accordance with the first aspect, the heat sink includes fins extending outside the casing, the fins in heat exchange relationship with the photovoltaic cells.

Still in accordance with the first aspect, a ballast is secured to the hoop, the hoop securable to the underwater ground via the ballast.

Still in accordance with the first aspect, the at least one motor is a step motor.

Still in accordance with the first aspect, a portion of the casing facing the photovoltaic cell array is a Fresnel lens.

Still in accordance with the first aspect, a reflective cone is secured within the casing at a location where the Fresnel lens converges solar rays, the photovoltaic cell array circumferentially extending around a periphery of the casing and around a central axis of the casing.

Still in accordance with the first aspect, a height of the photovoltaic cell array in a direction parallel to the central axis is greater than a height of the reflective cone taken along the central axis.

Still in accordance with the first aspect, the casing has a substantially hemispherical shape.

In accordance with a second aspect, there is provided a method of operating a solar power generator having a photovoltaic cell array within a casing secured to a hoop via a shaft, comprising: obtaining parameters relative to a variation of a position of the sun through a given day and relative to an altitude of the sun during the given day; and moving the casing so that the photovoltaic cell array is oriented substantially perpendicularly relative to solar rays by: pivoting the casing about a first axis transverse to the shaft to orient the photovoltaic cell array at the altitude; and rotating the casing about a second axis defined by the shaft to follow the sun from sunrise to sunset.

Still in accordance with the second aspect, obtaining the parameters comprises obtaining latitude and longitude coordinates of the solar power generator.

Still in accordance with the second aspect, rotating the casing about the second axis includes continuously rotating the casing about the second axis throughout the day.

Still in accordance with the second aspect, pivoting the casing about the first axis comprises moving the casing relative to the hoop.

Still in accordance with the second aspect, ends of the shaft are in driving engagement with the hoop and wherein the casing is rotatable relative to the shaft, moving the casing relative to the hoop comprises moving the ends of the shaft relative to the hoop by actuating at least one motor secured to the casing and in driving engagement with the shaft.

Still in accordance with the second aspect, rotating the casing about the second axis defined by the shaft comprises limiting rotation of the shaft relative to the hoop and actuating at least one motor secured to the casing and in driving engagement with the shaft.

Still in accordance with the second aspect, the method further comprises converging the solar rays on the photovoltaic cell array.

Still in accordance with the second aspect, the method further comprises converging the solar rays on a reflective cone within the casing and reflecting the converged solar rays from the reflective cone to the photovoltaic cell array that extends circumferentially around a central axis of the casing.

In accordance with a third aspect, there is provided an assembly comprising a plurality of solar power generators of the first aspect described above, each of the plurality of solar power generators secured to one another and securable to an underwater ground.

In accordance with a fourth aspect, there is provided a solar power generator comprising: a frame securable to an underwater ground surface; a shaft supported by the frame; a casing floatable on a body of water and movably mounted to the frame via the shaft, the casing rotatable relative to the frame about a first axis defined by the shaft; a photovoltaic cell array secured to the casing; and a motor operatively connected to the casing for rotating the casing about the first axis to orient the photovoltaic cell array towards a sun in function of an azimuth of the sun.

Still in accordance with the fourth aspect, the casing is pivotable about a second axis transverse to the first axis, the solar power generator comprising a braking device, the shaft rotatable relative to the casing about the first axis and rotatable relative to the frame about the second axis, the motor drivingly engaged to the shaft and secured to the casing, the braking device operable in an engaged position in which rotation of the shaft about the first axis is limited and in which actuation of the motor rotates the casing about the first axis, and in a disengaged position in which the shaft is rotatable relative to the casing about the first axis and in which the actuation of the motor rotates the casing about the second axis.

Still in accordance with the fourth aspect, the braking device is a solenoid having a housing and a rod movable relative to the housing from a retracted position corresponding to the disengaged position to an extended position corresponding to the engaged position.

Still in accordance with the fourth aspect, the solenoid is secured within the shaft.

Still in accordance with the fourth aspect, rack gears are secured to the frame, the shaft drivingly engaged to pinion gears meshed with the rack gears, rotation of the shaft about the first axis translating into translation of the pinion gears relative to the rack gears and into rotation of the shaft and of the casing about the second axis, one or more of the frame and the track gears defining a plurality of apertures circumferentially distributed about the second axis, the braking device engaging any one of the apertures when the braking device is in the engaged position.

Still in accordance with the fourth aspect, a heat sink is secured to the casing, the heat sink providing heat exchange relationship between photovoltaic cells of the photovoltaic cell array and an environment outside the casing.

Still in accordance with the fourth aspect, a Fresnel lens is secured to the casing opposite the photovoltaic cell array to converge the solar rays on the photovoltaic cell array.

Still in accordance with the fourth aspect, a reflective cone is secured within the casing at a location where the Fresnel lens converges solar rays, photovoltaic cells of the photovoltaic cell array secured to the casing and circumferentially distributed around a central axis of the cone.

Still in accordance with the fourth aspect, the reflective cone has a top portion exposed to the solar rays and a bottom portion in heat exchange relationship with an environment outside the casing, a thermoelectric generator between the top portion and the bottom portion and in heat exchange relationship with the top portion and the bottom portion, the thermoelectric generator electrically connected to the motor.

Still in accordance with the fourth aspect, a height of the photovoltaic cell array in a direction parallel to a central axis of the reflective cone is greater than a height of the reflective cone taken along the central axis.

Still in accordance with the fourth aspect, a ballast is slidingly engaged to the frame, the frame securable to the underwater ground via the ballast, the frame movable relative to the ballast, a second motor secured to the shaft and in driving engagement with a pulley, a cable having both extremities secured to the ballast, the cable wrapped around the pulley, rotation of the pulley by the second motor causing translation of the frame relative to the ballast thereby rotating the casing about a second axis transverse to the first axis to follow an altitude of the sun.

In accordance with a fifth aspect, there is provided a solar power generator comprising: a frame securable to an underwater ground surface; a shaft supported by the frame; a casing floatable on a body of water and movably mounted to the frame via the shaft, the casing rotatable relative to the frame about a first axis defined by the shaft, the casing pivotable about a second axis transverse to the first axis; a photovoltaic cell array secured within the casing; and means for rotating the casing about the first axis to orient the photovoltaic cell array towards a sun in function of an azimuth of the sun and for rotating the casing about the second axis in function of an altitude of the sun.

Still in accordance with the fifth aspect, the means have a motor secured to and within the casing and in driving engagement with the shaft, the shaft rotatable relative to the casing about the first axis, pinion gears drivingly engaged by the shaft and meshed with rack gears secured to the frame, and a braking device operable to selectively allow rotation of the shaft relative to the frame to rotate the pinion gears and to rotate the shaft about the second axis by translating the pinion gears along the rack gears, or limit rotation of the shaft relative to the frame thereby causing a torque generated by the motor to be transferred to the casing thereby rotating the casing about the first axis.

In accordance with a sixth aspect, there is provided a method of operating a solar power generator having a photovoltaic cell array within a casing floatingly supportable on a body of water and secured to a frame via a shaft, comprising: obtaining parameters relative to a variation of a position of the sun through a given day and relative to an altitude of the sun during the given day; and moving the casing to minimize angles between axes normal to photovoltaic cells of the photovoltaic cell array and solar rays impacting the photovoltaic cells by: rotating the casing about a first axis parallel to the shaft to follow an azimuth of the sun; and rotating the casing about a second axis perpendicular to the first axis to follow the altitude of the sun.

Still in accordance with the sixth aspect, obtaining the parameters comprises obtaining latitude and longitude coordinates of the solar power generator.

Still in accordance with the sixth aspect, rotating the casing about the first axis includes continuously rotating the casing about the first axis throughout the day.

Still in accordance with the sixth aspect, the shaft is in driving engagement with pinion gears, the pinion gears meshed with rack gears secured to the frame, the method comprising: allowing the shaft to rotate relative to the frame to drive the pinion gears with the motor via the shaft to rotate the casing about the second axis, or limiting rotation of the shaft relative to the frame to rotate the casing about the first axis with the motor.

Still in accordance with the sixth aspect, the solar rays are converged on the photovoltaic cell array.

Still in accordance with the sixth aspect, the solar rays are converged on a reflective cone located inside the casing and reflecting the converged solar rays from the reflective cone to photovoltaic cells of the photovoltaic cell array, the photovoltaic cells circumferentially distributed around a central axis of the cone.

Still in accordance with the sixth aspect, power is generated with a thermoelectric generator in heat exchange relationship with the reflecting cone.

DESCRIPTION OF THE DRAWINGS

Reference is now made to the accompanying figures in which.

DETAILED DESCRIPTION

Figure 1:
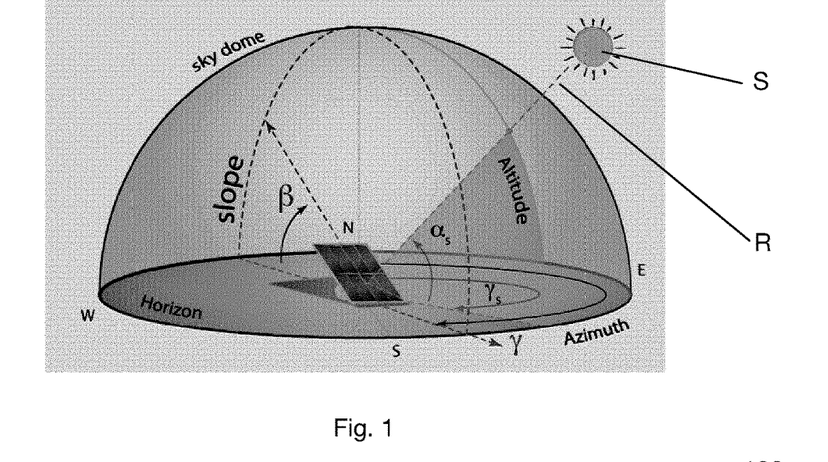
FIG. 1 is a schematic three-dimensional view of a photovoltaic cell array in accordance with one embodiment, exposed to the sun.

Referring to FIG. 1, the efficiency of a photovoltaic cell array is directly correlated to its incidence with solar rays R from the sun S. The sun S moves along two degrees of freedom in spherical coordinates. The first degree of freedom is the azimuth, which is the variation of the position of the sun S along an East-West E, W direction that varies as a function of the time of day, from sunrise to sunset. The second degree of freedom is the altitude of the sun S with respect to the zenith, which varies throughout the year. Consequently, the efficiency of a photovoltaic cell array may be improved by moving said array throughout the day and throughout the year so that the sun's rays R perpendicularly intersect the photovoltaic cell array substantially at all time. Moreover, as 71% of the surface of the Earth is covered with water, photovoltaic cell arrays may be disposed over bodies of water.

Figure 2:
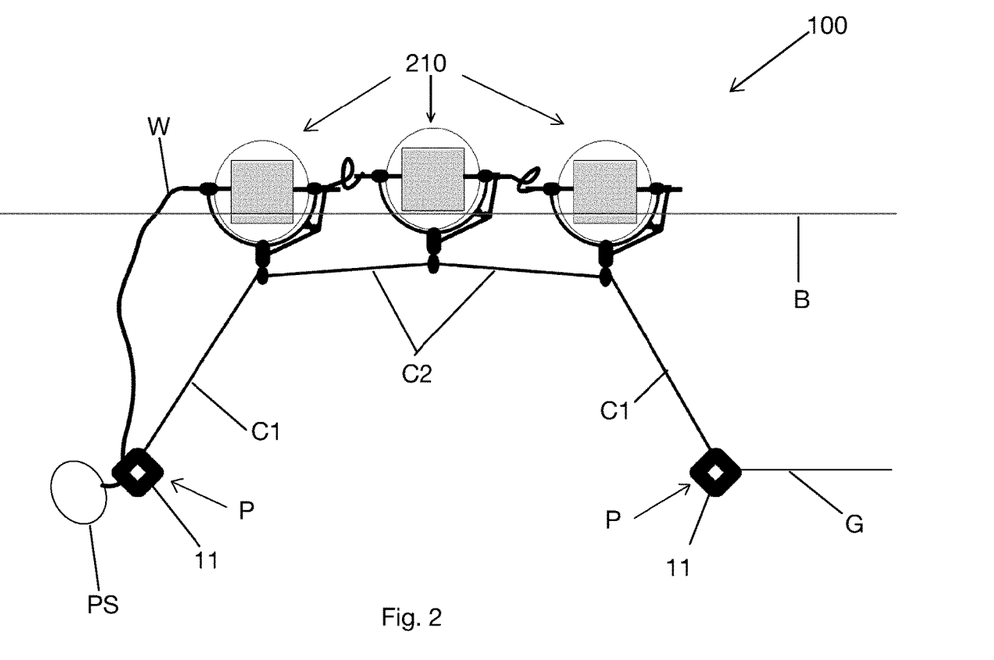
FIG. 2 is a schematic front view of an arrangement of solar power generators floating on a body of water in accordance with one embodiment.

Referring to FIG. 2, a possible embodiment of a solar power generator arrangement is generally shown at 100. In the embodiment shown, the solar power generator arrangement 100 includes a plurality, three in the depicted embodiment, of solar power generators 210 that float on a body of water B, such as a lake, a sea, an ocean, and so on.

The arrangement 100 may be anchored to underwater ground G via cables C1 or any other suitable means. In the embodiment shown, the arrangement 100 is secured to the ground G via two cables C1 extending from two anchoring points P on the ground G to extremities of the arrangement 100. The cables C1 may be secured to the underwater ground G via spring pulleys 11 that may allow the cable C1 to elongate to absorb variations in a level of water caused by rain, waves, and/or tide.

Intermediate cables C2 interconnect the solar power generators 210 to one another and are maintained under tension in such a way that a minimal distance between the generators 210 is maintained. The intermediate cables C2 may absorb movement of the generators 210 caused by waves and/or wind. The intermediate cables C2 may be maintained under tension by sufficiently spreading apart the anchoring points P. Other configurations are contemplated without departing from the scope of the present disclosure. The generators 210 may be disposed linearly, as shown in FIG. 2, or in a matrix (e.g., 2 by 2) with cables C1 connected to each corner of the matrix.

The solar power generators 210 may be connected to each other via wires W. The wires W may be operatively connected to a power source PS, such as an off shore power station, for providing or distributing energy generated by the generators 210. In a particular embodiment, the power source PS is used to provide energy to the generators 210 to allow them to orient themselves at the appropriate angle relative to the solar rays R.

Figure 3:
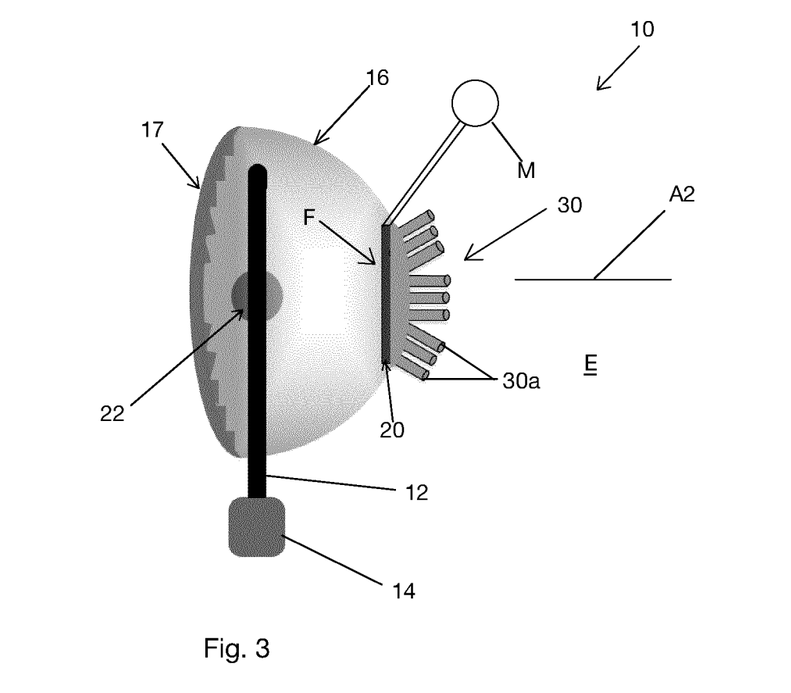
FIG. 3 is a schematic side view of a solar power generator in accordance with one embodiment.
Figure 4:
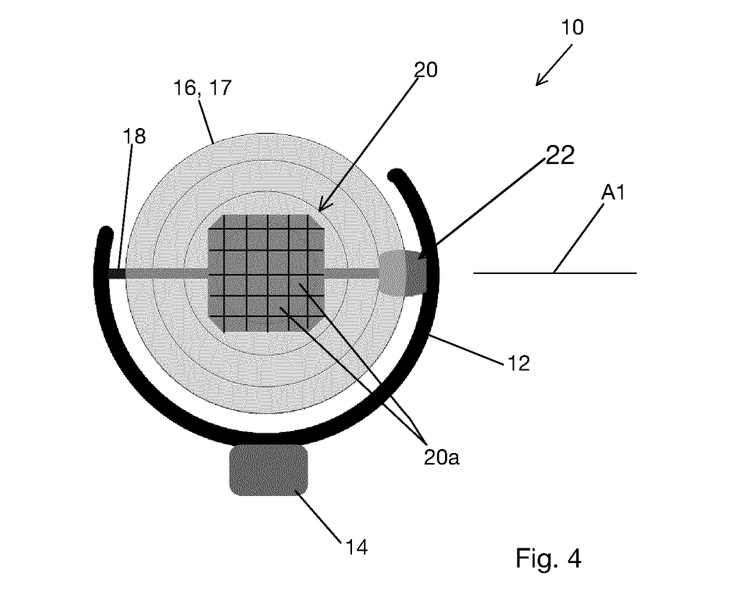
FIG. 4 is a front view of the solar power generator of FIG. 3.

Referring to FIGS. 3-4, a solar power generator in accordance with one embodiment is generally shown at 10. The solar power generator 10 is configured to be movable to be oriented along two degrees of freedom to follow the sun S (FIG. 1) throughout any given day of a year and throughout each days of the year. That is, movement of the solar power generator 10 along the first degree of freedom allows a photovoltaic cell array 20 to face the sun S from sunrise to sunset whereas movement of the solar power generator 10 along the second degree of freedom allows the photovoltaic cell array 20 to face the sun S as the altitude of the sun S varies day by day throughout the year. For instance, the altitude may be greater during summer than it is during winter. Seasons may be determined as a function of a geographical location of the solar power generator 10. Following the sun S allows to maximize radiation of the photovoltaic cell array 20. Moving the photovoltaic cell array 20 allows to minimize angles between axes normal to photovoltaic cells of the cell array and solar rays impacting the photovoltaic cells for maximizing an electrical output generated by said cells.

The solar power generator 10 includes a frame 12 depicted in the present embodiment as a hoop. The frame 12 may be attached to the underwater ground G (FIG. 2) via the cables C1 (FIG. 2). In the embodiment shown, a ballast 14 is secured to the frame 12; the frame 12 being secured to the ground G via the ballast 14. The ballast 14 may allow the solar power generator 10 to keep its position on choppy waters. In other words, the ballast 14 may provide stability to the generator 10.

The solar power generator 10 further has a casing 16 that is rotatably mounted to the frame 12 via a shaft 18. The casing 16 is configured to float on the body of water B. Air, or any suitable gas, may be located within the casing 16 to allow the casing 16 to float on its own on the water. In the embodiment shown, the frame 12 extends substantially around the casing 16. It will be appreciated that a shape of the frame 12 is substantially circular to allow the shaft 18 to pivot relative to the frame 12 about the second axis A2. A length of the shaft 18 is therefore at least a diameter of the frame 12.

In the embodiment shown, a lens 17 is secured to the casing 16. In some embodiments, the lens 17 and the casing 16 may have mating flanges securable to one another via suitable fasteners. The lens 17 is configured to converge the solar rays R toward a plane at location F opposite the lens 17. The lens 17 may be a Fresnel lens or any other suitable lens capable of converging the rays from a larger surface area (i.e. on the lens 17) to a smaller surface area (i.e. the location F). The casing 16 may be transparent to allow light to pass therethrough and reach the water to limit environmental impacts of the generator 10 on aquatic life. The casing 16 combined with the lens 17 may have a spherical, hemispherical, or any suitable shape. Such a shape may decrease a drag force exerted by the wind on the casing 16 compared to a flat plate configuration and/or may allow debris to be removed.

The photovoltaic cell array 20 is secured to the casing 16 and is located at the location F such that the lens 17 converges the solar rays R toward the photovoltaic cell array 20. The casing 16 may define an opening located opposite the lens 17; the opening being sized to receive the photovoltaic cell array 20. The photovoltaic cell array 20 may have any suitable shape, such as circular or rectangular. The photovoltaic cell array 20 may include a matrix of photovoltaic cells 20a disposed adjacent one another to cover the location F. The photovoltaic cells may be made of monocrystalline silicon, polycrystalline silicon, amorphous silicon, or any other material suitable for absorbing sunlight as a source of energy to generate electrical energy therefrom. It is understood that the photovoltaic cell array 20 is operatively connected to a storage means M to store electrical energy generated by the photovoltaic cell array 20 from the solar rays R. The storage means M may be, for instance, a battery. Although illustrated as separate from the photovoltaic cell array 20, the storage means M may be integrated therewith. In some embodiments, the storage means M are separate from the photovoltaic cell array 20 but encompassed inside the casing 16. Alternatively, or in combination therewith, the photovoltaic cell array 20 may be directly connected to device(s) in need of electricity via suitable wires. In a particular embodiment, the generators are electrically connected to an existing electric network via a power inverter. The power inverter is used to convert the direct current generated by the photovoltaic cell arrays in alternative current.

The casing 16 is rotatable relative to the frame 12 about a first axis A1 (FIG. 4) defined by the shaft 18. The shaft 18 is pivotable about a second axis A2 (FIG. 3) transverse to the first axis A1. The shaft 18 may pivot relative to the second axis A2 relative to the frame 12 or, alternatively, both of the shaft 18 and the frame 12 may pivot together relative to the second axis A2. Rotation of the casing 16 about the first axis A1 allows the photovoltaic cell array 20 to follow the sun S from sunrise to sunset whereas rotation of the casing 16 about the second axis A2 allows the photovoltaic cell array 20 to follow the altitude of the sun S.

Figure 5:
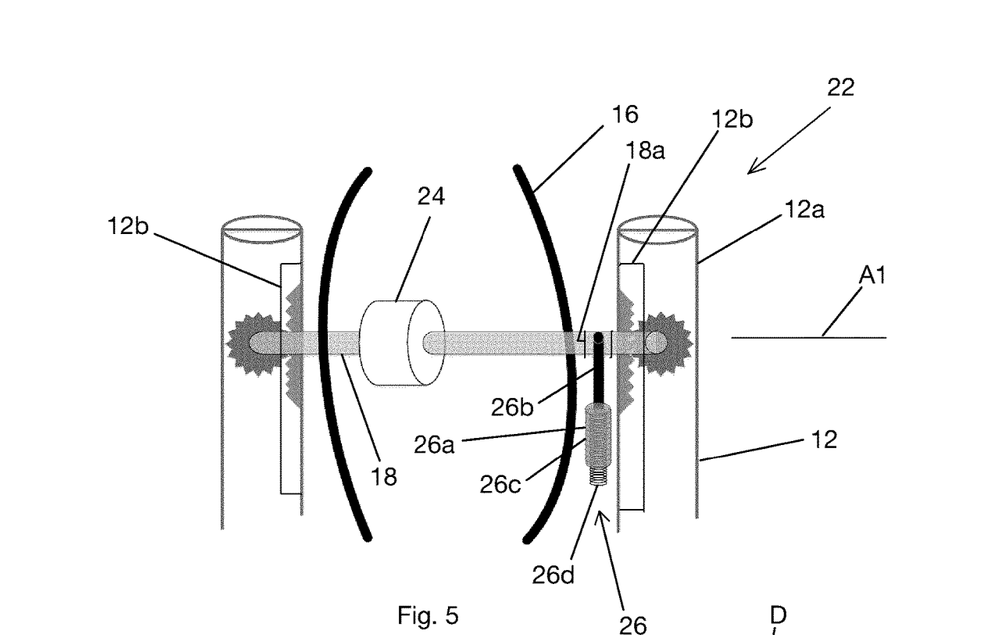
FIG. 5 is a schematic partially transparent front view of the solar power generator of FIG. 3 illustrating a mechanism to move a photovoltaic cell array of the solar power generator of FIG. 3, the mechanism illustrated in a first configuration.
Figure 6:
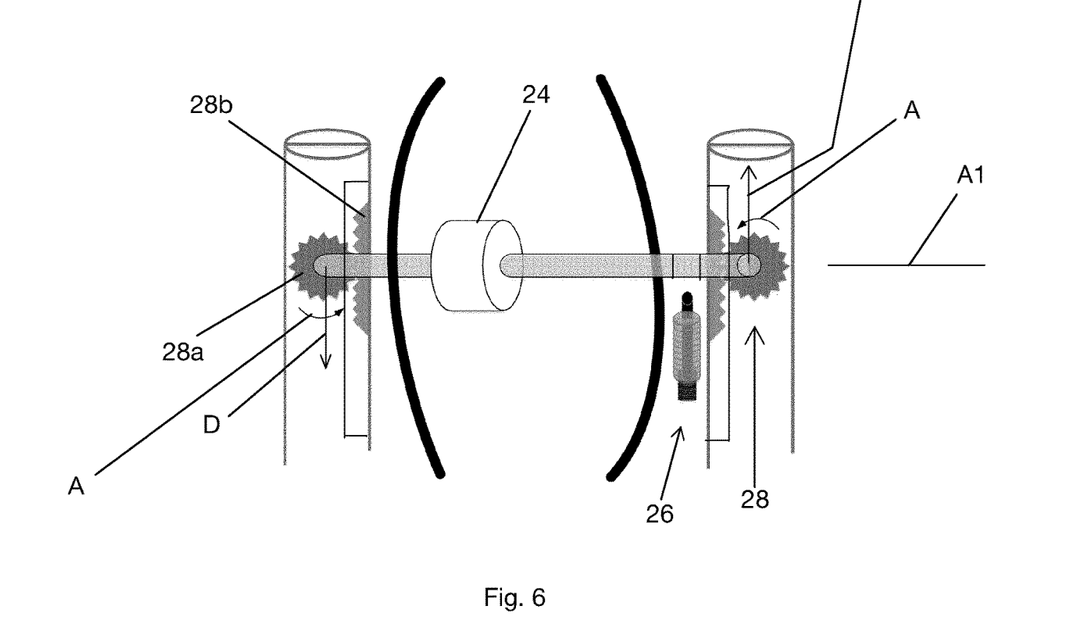
FIG. 6 is a schematic partially transparent front view of the solar power generator of FIG. 3 illustrating the mechanism of FIG. 5 in a second configuration.

Referring to FIGS. 5-6 with continued reference to FIGS. 3-4, a powertrain 22 is used for moving the casing 16, and the photovoltaic cell array 20 secured thereto, about the first and second axes A1, A2. In the embodiment shown, the powertrain 22 has a motor 24, which may be a step motor. The powertrain 22 is in engagement with the casing 16 and with the frame 12 and is operable in a first or engaged configuration (FIG. 5) in which the motor 24 causes rotation of the casing 16 about the first axis A1 and in a second or disengaged configuration (FIG. 6) in which the motor 24 causes rotation of the casing 16 about the second axis A2. The motor 24 may be operatively connected to the power source PS (FIG. 2) and/or to another power source directly integrated within the motor 24, such as a battery. The motor 24 may draw its power directly from the photovoltaic cell array 20. The motor 24 may draw its power directly from the photovoltaic cell array 20 via a voltage converter.

In the depicted embodiment, the motor 24 is secured to the casing 16 and is in driving engagement with the shaft 18. More specifically, the motor 24, as known in the art, has a stator portion and rotor portion. The stator portion is secured to a case of the motor 24. The rotor portion is typically a shaft that rotates relative to the stator portion. In the embodiment shown, the case of the motor 24 is attached to the casing 16 whereas the rotor portion is drivingly engaged to the shaft 18.

In the embodiment shown, the casing 16 is rotatably mounted on the shaft 18. That is, the shaft 18 extends through walls of the casing 16. Apertures of a suitable size are defined through the casing 16 to receive the shaft 18 in the apertures. Bearings may be provided between the casing 16 and the shaft 18 to rotatably support the casing 16 on the shaft 18. Such bearings may be received within the apertures and bridge gaps between peripheral walls of the apertures and the shaft 18. Sealing means may be used to seal the inside of the casing 16 from the water of the environment E.

It will be appreciated that the motor 24 may be able to maintain the position of the casing 16 relative to the frame 12 when the motor 24 is unpowered. This may be possible, for instance, by using a step motor having this locking capability. It may also be possible to use the motor 24 in driving engagement with a worm gear and having the worm gear meshed with a gear. The shaft 18 may be concentric with the gear. Therefore, when the motor 24 is unpowered, the gear is not able to induce rotation of the worm gear. Only the worm gear may cause rotation of the gear. Any other suitable means are contemplated. For instance, a brake may be used to immobilize the casing 16 when the motor 24 is unpowered.

In the embodiment shown, the position of the casing 16 relative to the frame 12 is adjusted every 15 minutes to follow the azimuth of the sun. The position of the casing 16 relative to the altitude of the sun S may be adjusted once a day, before sunrise. The position of the casing 16 may be adjusted at different time intervals. In some embodiments, the position of the casing 16 may be continuously changed by keeping the motor 24 powered from the sunrise to the sunset of the sun.

The powertrain 22 includes a braking device 26 configured to limit and/or prevent rotation of the shaft 18 relative to the frame 12. In the present embodiment, the braking device 26 includes a housing 26a and a rod 26b movable relative to the housing 26a. The rod 26b is movable relative to the housing 26a between a retracted position (FIG. 6) in which the rod 26*b* is disengaged from the shaft 18 and an extended position (FIG. 5) in which the rod 26*b* is slidably received within an aperture 18*a* defined through the shaft 18. In the present embodiment, the braking device 26 is a solenoid including an electro-magnet 26*c*; electrification of the electro-magnet 26*c* of the braking device 26 causes the rod 26*b* to retract in the housing 26*a* and from the aperture 18*a* of the shaft 18. The braking device 26 is operable in an engaged position in which rotation of the shaft 18 about the first axis A1 is limited and in which actuation of the motor 24 rotates the casing 16 about the first axis A1. The braking device 26 is operable in a disengaged position in which the shaft 18 is rotatable relative to the casing 16 about the first axis A1 and in which the actuation of the motor 24 rotates the casing 16 about the second axis A2. Movement of the casing 16 about the first axis A1 allows the photovoltaic cell array 20 to follow the sun S from sunrise to sunset.

The braking device 26 may be slidingly engaged to the frame 12 such that the braking device 26 moves along the frame 12 to follow movements of the shaft 18. Following movements of the shaft 18 allows the braking device 26 to block rotation of the shaft 18 regardless of the position of the casing 16, and of the shaft 18, about axis A2. In other words, the braking device 26 is movable with the casing 16 about axis A2 to allow the braking device 26 to block rotation of the shaft 18 relative to the frame 12 regardless of the altitude of the sun.

The rod 26*b* and the aperture 18*a* defined through the shaft 18 are not always in register. Therefore, the braking device 26 includes a biasing member 26*d* that is used for attaching the housing 26*a* to the frame 12. In other words, the braking device 26 is secured to the frame 12 via the biasing member 26*d*. The biasing member 26*d* may be, for instance, a spring, and is configured to bias a tip of the rod 26*b* against the shaft 18 when the braking device is in the extended position and when the rod and the aperture are not aligned. Actuation of the motor 24 causes rotation of the shaft 18 about the first axis A1 relative to the rod 26*b* until the rod 26*b* and the aperture 18*a* become in register or aligned. At this point, the biasing member 26*d* causes the rod 26*b* to penetrate the aperture 18*a* to limit rotation of the shaft 18 relative to the frame 12.

Referring more particularly to FIG. 5, rotation of the shaft 18 is limited upon the rod 26*b* of the braking device 26 engaging the shaft 18, thereby causing actuation of the motor 24 to induce rotation of the casing 16 to rotate about the shaft 18 and about the first axis A1. It will be appreciated that when the motor 24 is powered, a torque is generated between the rotor and the stator of the motor 24. Typically, this torque causes rotation of the rotor (e.g., shaft) because the moment of inertia of the rotor is less than that of the stator, which is usually secured to another component, further increasing its moment of inertia.

In the embodiment shown, a moment of inertia of the frame 12 having the ballast 14 secured thereto is greater than that of the casing 16 having the lens 17 and the photovoltaic cell array 20 secured thereto. This difference in moments of inertia about the first axis A1 allows the casing 16 to rotate while the frame 12 remains substantially immobile. In other words, when rotation of the shaft 18 relative to the casing 16 is limited, the case of the motor 24 moves integrally with the casing 16 whereas the shaft 18 moves integrally with the frame 12. Since the moment of inertia of the shaft 18/frame 12/ballast 14 about the first axis A1 is greater than the moment of inertia of the casing 16/photovoltaic cell array 20/heat sink 30 about the first axis A1, the casing 16 rotates about the axis A1.

Referring more particularly to FIG. 6, the powertrain 22 includes gears 28 in engagement with the shaft 18. The gears 28 include two pinion gears 28*a* each in driving engagement with a respective one of opposite ends of the shaft 18 and two rack gears 28*b* each secured to a respective one of opposite sides of the frame 12. Upon the rod 26*b* of the braking device 26 being disengaged from the shaft 18, actuation of the motor 24 causes rotation of the shaft 18 relative to the casing 16 and causes rotation of the pinion gears 28*a*, which are each in driving engagement with a respective one of the rack gears 28*b*. Rotation of the pinion gears 28*a* following arrows A therefore causes translation of the opposite ends of the shaft 18 along arrows D relative to the frame 12. Such movements of the opposite ends of the shaft 18 relative to the frame 12 cause the shaft 18, and the casing 16 mounted thereto, to rotate about the second axis A2 transverse to the shaft 18. Movement of the casing 16 about the second axis A2 allows the photovoltaic cell array 20 to follow the altitude of the sun S. In the present embodiment, the moment of inertia of the casing 16 is greater than that of the gears 28 thereby allowing actuation of the motor 24 to rotate the gears 28 and to pivot the shaft 18 about the second axis A2 while the casing 16 remains substantially immobile.

Still in reference to FIG. 6, rotation of the shaft 18 relative to the casing 16 is permitted when the braking device 26 is disengaged from the shaft 18. Therefore, in such a case, the motor 24 is drivingly engaged to the casing 16 via the pinion gears 28*a* and the rack gears 28*b*. Thus, when the motor 24 is powered, rotation of the shaft 18 about the first axis A1, and of the casing 16 about the second axis A2 occur. When the rotation of the shaft 18 about the first axis A1 is permitted, rotation of the casing 16 about axis A1 is substantially limited because the torque perceived by the casing 16 about axis A2 is greater than that about axis A1.

This situation occurs because, when the shaft 18 is free to rotate about the first axis A1, the torque exerted on the casing 16 by the motor 24 and about axis A1 divided by the moment of inertia of the casing 16 (and of the other components secured to the casing 16) about axis A1 is less than the torque exerted by the motor 24 on the casing 16 about axis A2 divided by the moment of inertia of the casing 16 (and of the other components secured to the casing 16) about axis A2. The opposite occurs when the braking device 26 is engaged to the shaft 18.

In the embodiment shown, a gear ratio is created by the pinion gears 28*a* and the track gears 28*b*. Such a gear ratio may increase a torque generated by the motor 24 and perceived by the casing 16 about the second axis A2. Hence, it will be appreciated that the moment of inertia of the casing 16 relative to the axis A1 is not required to be different than the moment of inertia of the casing 16 relative to the axis A2 because of this gear ratio.

The braking device 26 may thus be used to transfer the moment of inertia of the frame 12 and of the ballast 14 to the shaft 18. In FIG. 6, the shaft 18 is rotatable relative to the frame 12 whereas, in FIG. 5, the shaft 18 is locked to the frame 12. Locking the shaft 18 to the frame 12 increases the moment of inertia of the shaft 18 beyond that of the casing 16. This results in the casing 16 rotating about the first axis A1.

It will be appreciated that the frame 12 may include tubular members 12*a* being hollow for receiving the rack gears 28*b* and the pinion gears 28*a*. The frame 12 may define longitudinal slots 12*b* on the frame 12 to allow movement of the shaft 18 relative to the frame 12 about axis A2. Sealing members, such as sealing lips, may be disposed over the longitudinal slots to seal the inside of the frame 12 from the environment E and to avoid water to penetrate inside the tubular members of the frame 12. The sealing lips may be secured to edges of the longitudinal slots 12b.

Referring back to FIGS. 3 and 4, in use, the photovoltaic cell array 20 may become hot as it may be subjected to solar radiation throughout the day. In the embodiment shown, the solar power generator 10 has a heat sink 30 that is secured to the casing 16 and that is located outside the casing 16. The heat sink 30 is configured to provide a heat exchange interface between the photovoltaic cell array 20 and an environment E outside the casing 16. In the embodiment shown, the heat sink 30 has fins 30a, which are cylindrical in the present embodiment, extending outside the casing 16 as a heat exchange interface for the environment E and the photovoltaic cell array 20. The fins 30a may interface with the environment E via convection with air and/or water of the environment E. The heat sink 30 may interface with the photovoltaic cell array 20 via conduction. Particularly, the heat from the photovoltaic cells 20a is transferred to the fins 30a via conduction and from the fins to the air and/or water of the environment E outside the casing 16 via convection. The heat sink 30 may allow the photovoltaic cell array 20 to run cooler compared to a configuration lacking such a heat sink 30.

Figure 7:
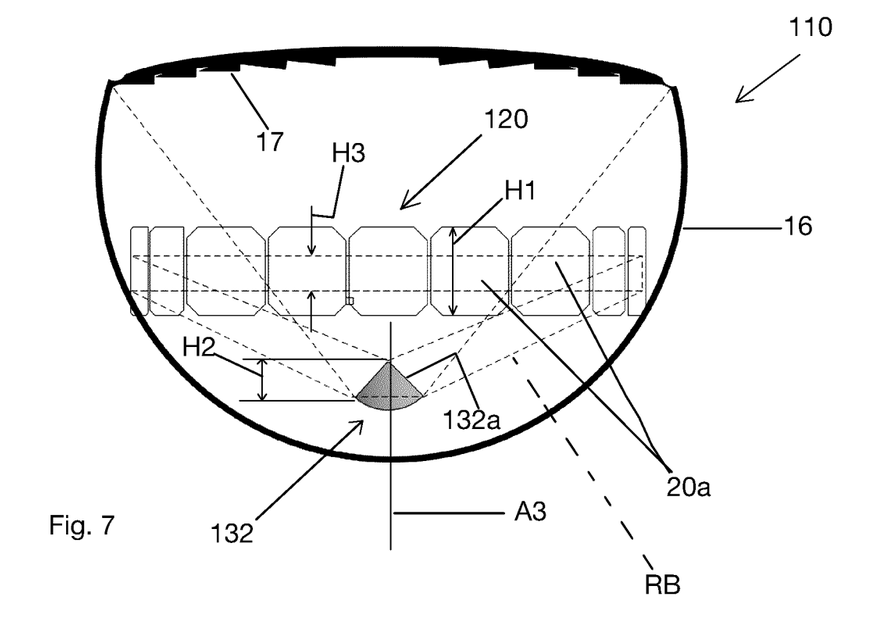
FIG. 7 is a schematic front view of a casing of a solar power generator having of a photovoltaic cell array secured thereto in accordance with another embodiment.
Figure 8:
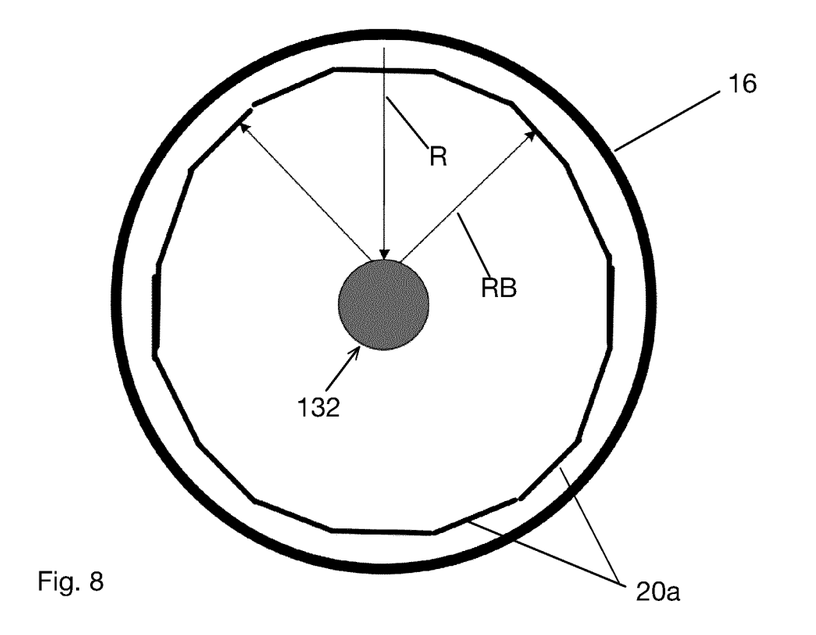
FIG. 8 is a top view of the casing and photovoltaic cell array of the solar power generator of FIG. 7.

Referring now to FIGS. 7-8, another embodiment of a solar power generator is generally shown at 110. For the sake of conciseness, only elements that differ from the solar power generator 10 of FIGS. 3-6 are described herein below.

The solar power generator 110 includes a photovoltaic cell ring array 120 having a plurality of solar cells 20a circumferentially distributed around a central axis A3 of the casing 16. The solar cells 20a may be secured to a periphery of the casing 16 within the casing 16. Each of the solar cells 20a may be normal to an axis that is perpendicular to the central axis A3. A reflective cone 132 is secured within the casing 16 at the focal location F and has a wall 132a circumferentially extending around the axis A3 of the casing 16. In the embodiment shown, the reflective cone 132 and the casing 16 are concentric. That is, the reflective cone 132 is centered on the central axis A3 of the casing 16. A cross-section of the reflective cone 132 taken on a plane normal to the central axis A3 of the casing 16 may have a circular shape. The reflective cone 132 may have a frusto-conical shape.

In use, the reflective cone 132 reflects the solar rays R from the location F and toward the photovoltaic cell ring array 120 extending around the central axis A3 of the casing 16. In the embodiment shown, a height H1 of the photovoltaic cell ring array 120 taken along the central axis A3 of the casing 16 is greater than a height H2 of the reflective cone 132 taken along the central axis A3. Therefore, a reflective band RB of the solar rays R to the photovoltaic cell ring array 120 may have a height H3 that is less than the height H1 of the photovoltaic cell ring array 120. As the casing 16 floats on the body of water B, it is subjected to movement caused by waves and/or by wind blowing against the casing 16. Having the height H3 of the reflective band RB, and the height H2 of the reflective cone 132, less than the height H1 of the photovoltaic cell ring array 120 may allow the reflective band RB to always land on the photovoltaic cell ring array 120 regardless of the movement of the casing 16 on the body of water B. Such a configuration may allow more solar radiation to be captured by the photovoltaic cell ring array 20.

Although not illustrated, the heat sink 30, which may be made of aluminum or any suitable material, is secured to the back of the casing 16 at a location opposite the lens 17 and is in heat exchange relationship with the reflective cone 132 to dissipate heat. The heat sink may extend further away from the cone 132 and may have a portion aligned with the cells 20a of the cell ring array 120 to dissipate heat from the cells 20a. Fins may be located at locations corresponding to the cells 20a or may be located only at the back of the casing 16 proximate the reflective cone 132.

Figure 9:
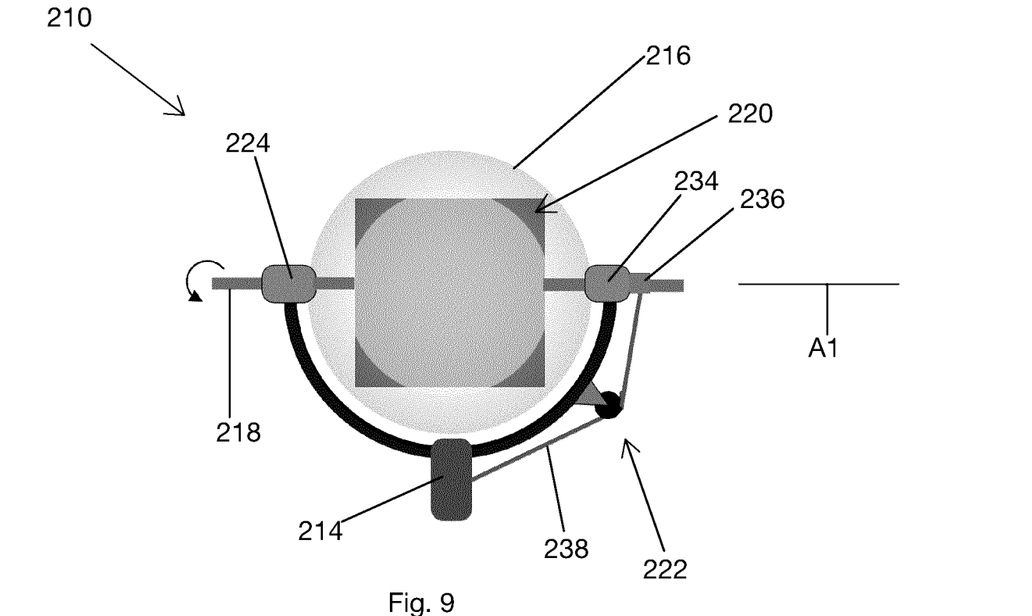
FIG. 9 is a schematic front view of a solar power generator in accordance with yet another embodiment.
Figure 10:
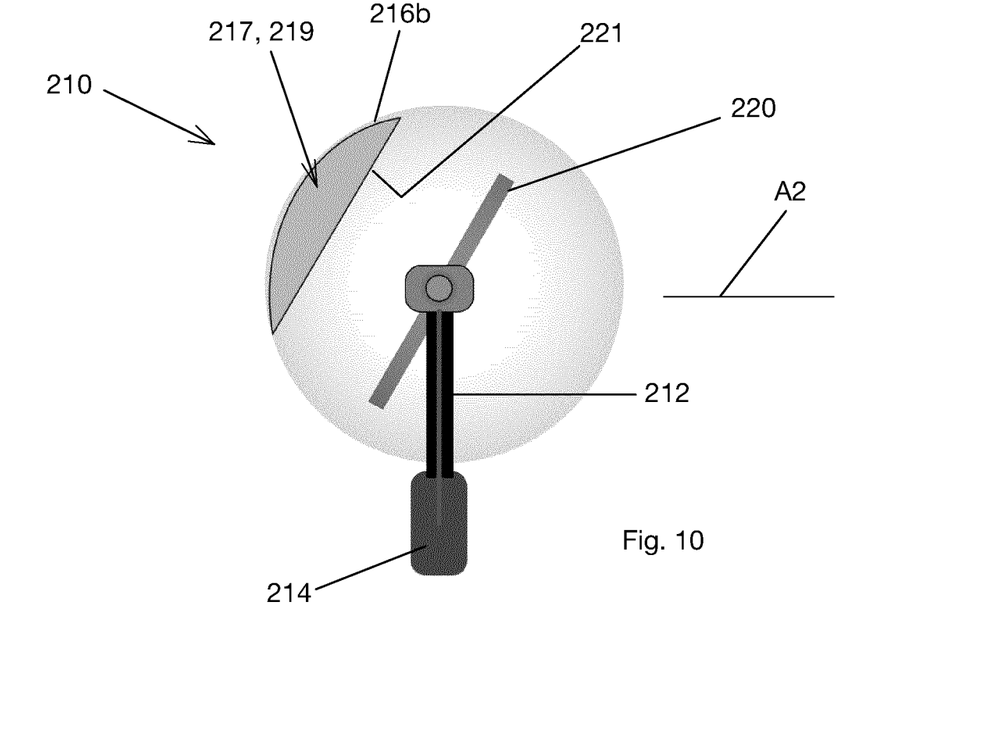
FIG. 10 is a schematic side view of the solar power generator of FIG. 9.

Referring now to FIGS. 9-10, another embodiment of a solar power generator is generally shown at 210. For the sake of conciseness, only elements that differ from the solar power generator 10 of FIGS. 3-6 are described herein below.

In the embodiment shown, the photovoltaic cell array 220 is located within the casing 216, which is transparent and has a spherical shape, and is secured to the shaft 218. The cell array 220 thereby moves integrally with the shaft 18 and with the casing 216. The casing 216 is secured to the shaft 218 for integral rotation therewith. A convex lens 217 is secured within the casing 216. Similarly to the lens 17 of FIG. 3, the convex lens 217 is configured to converge the solar rays R on the photovoltaic cell array 220.

In the embodiment shown, the convex lens 217 is created by water contained within a chamber 219 defined between a wall 216b of the casing 216 and a circular membrane 221 attached to the wall 216b of the casing 216. Other configurations are contemplated.

In the depicted embodiment, the frame 212 is slidingly engaged to the ballast 214 such that the frame 212 is movable relative to the ballast 214. The powertrain 222 has two motors 224, 234. The first motor 224 is in engagement with both the shaft 218 and the frame 212; actuation of the first motor 224 causes rotation of the shaft 218 and of the casing 216 secured thereto about the first axis A1 to follow the sun from sunrise to sunset. The second motor 234 is secured to the frame 212 and is in driving engagement with a pulley 236 rotatable relative to the shaft 218 about the axis A1. A cable or rope 238 is attached at both of its extremities to the ballast 214 and is wrapped around the pulley 236. Actuation of the second motor 234 in either direction winds the cable 238 around the pulley 236 thereby pulling on the ballast 214, which is slidably movable relative to the frame 212, to bring the ballast 214 closer to or farther from the second motor 234. As the ballast 214 is secured to the underwater ground via the cable C (FIG. 2), movements of the frame 212 relative to the ballast 214 causes the shaft 218 and the casing 216 secured thereto to pivot about the second axis A2 to follow the altitude of the sun S.

Figure 11:
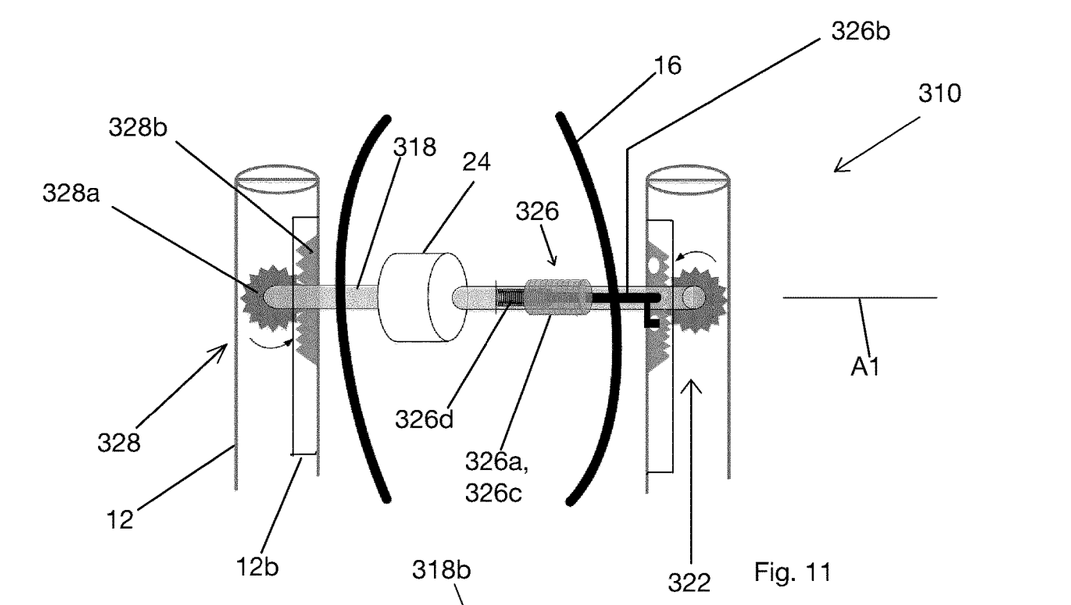
FIG. 11 is a schematic partially transparent front view of the solar power generator of FIG. 3 illustrating a mechanism in accordance with another embodiment to move the photovoltaic cell array, the mechanism illustrated in a first configuration.
Figure 12:
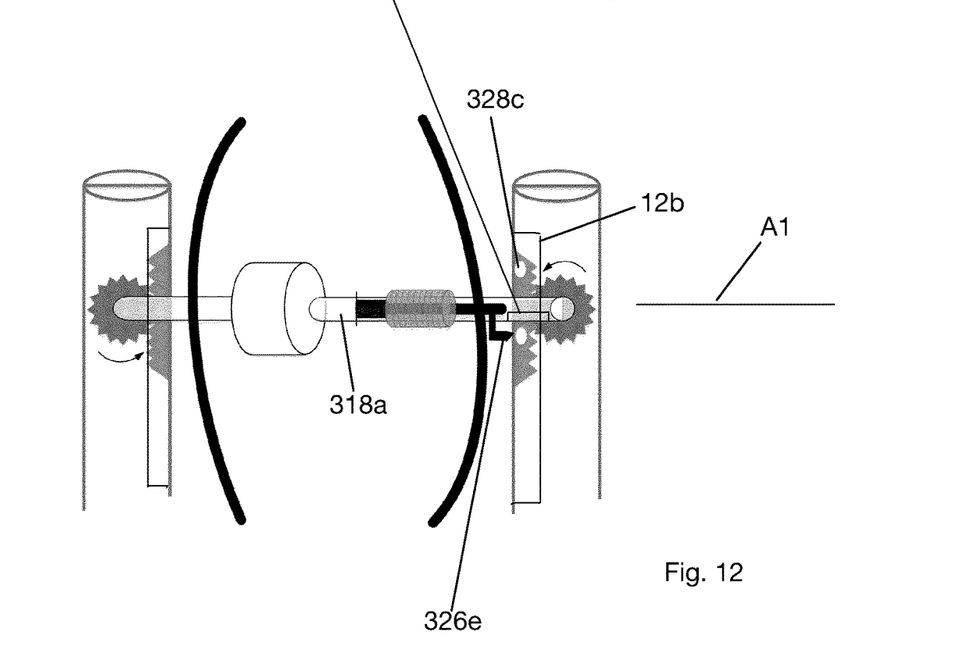
FIG. 12 is a schematic partially transparent front view of the solar power generator of FIG. 3 illustrating the mechanism of FIG. 11 in a second configuration.

Referring now to FIGS. 11-12, another embodiment of a solar power generator is generally shown at 310 and includes a powertrain 322. For the sake of conciseness, only elements that differ from the solar power generator 10 and the powertrain 22 of FIGS. 3-6 are described herein below. It will be appreciated that the powertrain 322 described below with reference to FIGS. 11-12 may be used with the solar power generators 10, 110 described above.

In the embodiment shown, the shaft 318 is hollow and defines an inner passage 318a. The braking device 326 is received inside the inner passage 318a of the shaft 318. The braking device 326 has a housing 326a secured to the shaft 318 and a rod 326b movable relative to the housing 326a longitudinally within the inner passage 318a of the shaft 318. The rod 326b is movable relative to the housing 326a between a retracted position (FIG. 12) in which the rod 326b is disengaged from the track gear 328b and an extended position (FIG. 11) in which the rod 326b is slidably received within an aperture 328c defined through the track gear 328b. In the present embodiment, the braking device 326 is a solenoid including an electro-magnet 326c; electrification of the electro-magnet 326c of the braking device 326 causes the rod 326b to retract in the housing 326a and from the aperture 328c of the track gear 328b. In a particular embodiment, the track gear 328b is located within the frame 12; the frame 12 defining an aperture in register with the aperture 328c of the track gear 328b. Alternatively, the aperture 328c may be defined solely through the frame 12. A plurality of apertures are defined through the frame 12 and/or the track gear 328 and circumferentially distributed around the second axis A2.

It will be appreciated that any means used to limit rotation of the shaft 18 relative to the frame 12 may be used without departing from the present disclosure. For instance, the braking device 326 may be located within the frame 12 and operable to selectively engage the pinion gears 328a thereby limiting rotation of the pinion gears 328a, and of the shaft 318, relative to the axis A1. A clutch may be operatively connected to the pinion gear(s) 328a for this purpose.

The rod 326b and the aperture 328c defined through the track gear 328b are not always in register. In the presented embodiment, the braking device 326 has a biasing member 326d that is used for attaching the housing 326a to the shaft 318 as described above with reference to FIGS. 5-6.

The hook 328e is provided in the form of a secondary rod being parallel to the rod 326b and radially offset from the rod 326b relative to a longitudinal axis of the rod 326b. In the embodiment shown, the hook 328e is located outside the shaft 318 and is able to move axially along the axis A1 relative to the shaft 318. For that purpose, the shaft 318 defines a longitudinal slot 318b that allows the hook 326e to protrude radially outside of the shaft 318 and that allows a sliding motion of the hook 326e relative to the shaft 318.

It will be appreciated that any suitable means for pivoting the casing 16 about the first and second axes A1, A2, and the photovoltaic cell array secured thereto, may be used without departing from the scope of the present disclosure. For instance, a rack gear may be secured to the casing and a pinion gear meshed with the rack gear may be secured to the frame and in driving engagement with a motor (e.g., electric motor). Rotation of the pinions causes the casing to rotate about axis A1. Similarly, the frame 12 may be movable relative to the ballast using a similar rack and pinion gear arrangements or any other suitable mechanisms. One or more actuators may be used for rotating the casing 16 about the first and second axes A1, A2. The one or more motors used to pivot the casing 16 about the first and second axes A1, A2 is/are in the present embodiments powered from the inside of the casing 16.

Figure 13:
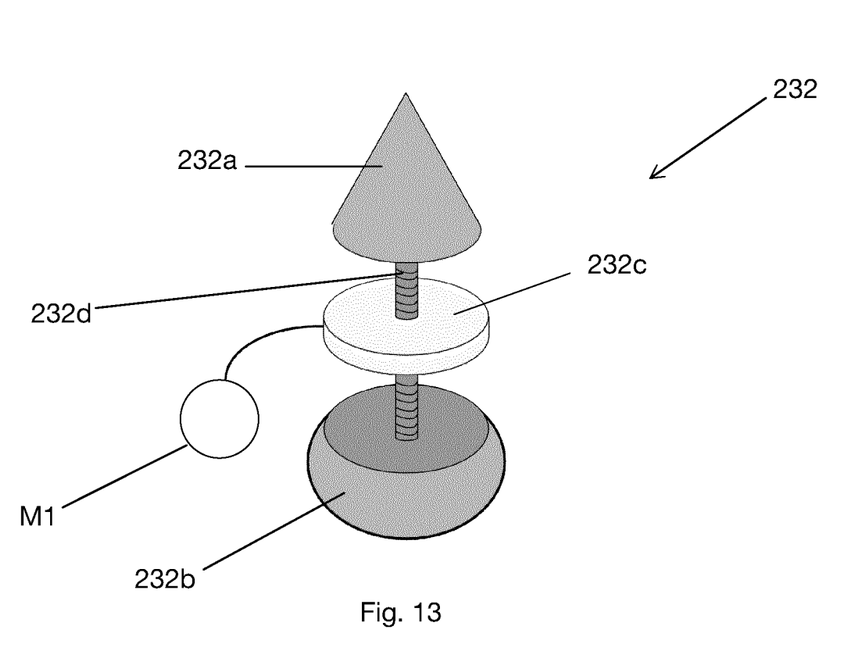
FIG. 13 is a schematic three dimensional exploded view of a reflective cone to be used with the generator of FIG. 7 in accordance with another embodiment.

Referring to FIG. 13, another embodiment of a reflective cone is shown at 232. The cone 232 may be used with the generator 110 of FIG. 7, for instance. The cone 232 is shown in exploded view in FIG. 13 and has a top portion 232a, a bottom portion 232b and a thermoelectric generator 232c between the top and bottom portions 232a, 232b. A fastener, such as a screw, 232d is used to secure the top and bottom portions 232a, 232b, and the thermoelectric generator 232c together. The thermoelectric generator 232c is in contact with both of the top portion and the bottom portion 232a, 232b. That is, the thermoelectric generator 232c has two opposed circular faces each contacting a respective one of the top and bottom portions 232a, 232b of the cone 232. Thermal grease may be disposed between mating surfaces of the top and bottom portions 232a, 232b and of the thermoelectric generator 232c for increasing a thermal conductivity of a contact between those components. The thermoelectric generator is configured to generate electrical power from a temperature difference between the top portion 232a and the bottom portion 232b. In use, the top portion 232a becomes because it is impacted by the solar rays. The bottom portion 232b is in heat exchange relationship with the heat sink 30 and is therefore cooler, typically by 50-60 degrees Celsius, than the top portion 232a. The thermoelectric generator 232c is in heat exchange relationship with both of the top and bottom portions 232a, 232b of the cone 232. This difference in temperatures is leveraged by the generator 232c to generate electrical power that may be stored in a storing medium M1. The storing medium M1 may be electrically connected to the motors 24, 224, 234 for powering the motors, the solenoid, and control circuits inside the casing 16 to move the casing 16 about axes A1, A2.

In the embodiment shown, the electrical power generated by the photovoltaic cell array 20, 120 is decoupled from that generated by the thermoelectric generator 232c. Therefore, the solar generators having the thermoelectric generator 232c may not require using the power generated by the photovoltaic cell array for its movements about the axes A1, A2.

Figure 14:
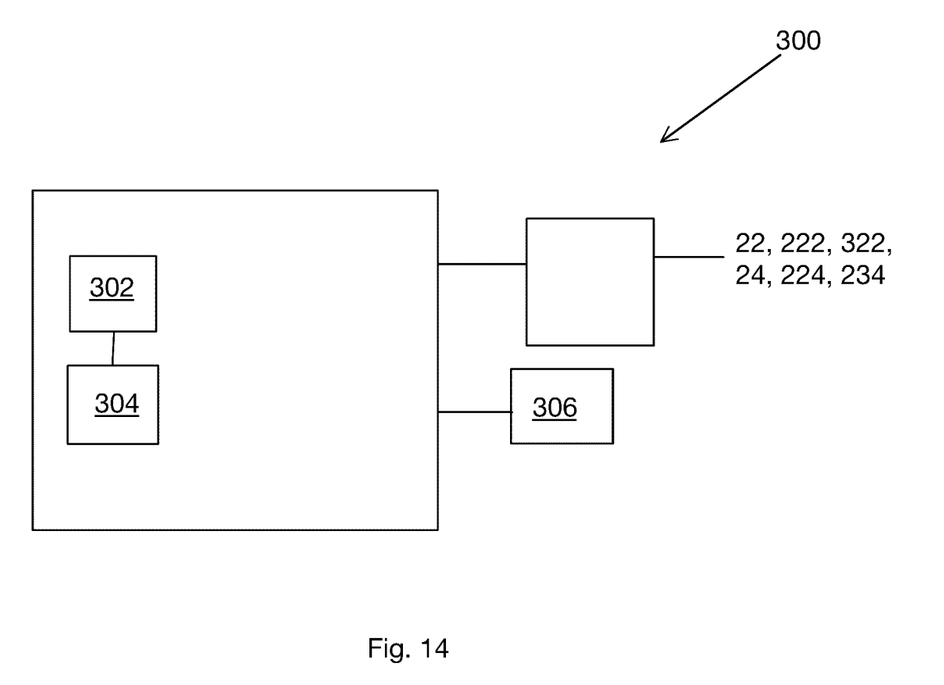
FIG. 14 is a schematic view of a controller for controlling any of the solar power generators of disclosed herein, in accordance with an embodiment.

Referring now to FIG. 14, a controller that may be operatively connected to the powertrains 22, 222, 322 and motors 24, 224, 234 of the solar power generators 10, 110, 210 is generally shown at 300. The controller 300 includes a processing unit 302 and a memory 304 operatively connected to the processing unit 302 and having instructions stored thereon for controlling position of the solar power generators 10, 110, 210 throughout the day and throughout the year. The processing unit 302 may comprise any suitable devices configured to cause a series of steps to be performed such that instructions, when executed by the controller 300 or other programmable apparatus, may cause the functions/acts/steps to be executed. The processing unit 302 may comprise, for example, any type of general-purpose microprocessor or microcontroller, a digital signal processing (DSP) processor, a CPU, an integrated circuit, a field programmable gate array (FPGA), a reconfigurable processor, other suitably programmed or programmable logic circuits, or any combination thereof.

The memory 304 may comprise any suitable known or other machine-readable storage medium. The memory 304 may comprise a non-transitory computer readable storage medium, for example, but not limited to, an electronic, magnetic, optical, electromagnetic, infrared, or semiconductor system, apparatus, or device, or any suitable combination of the foregoing. The memory 304 may include a suitable combination of any type of computer memory that is located either internally or externally to the controller 300, for example random-access memory (RAM), read-only memory (ROM), electro-optical memory, magneto-optical memory, erasable programmable read-only memory (EPROM), and electrically-erasable programmable read-only memory (EEPROM), Ferroelectric RAM (FRAM) or the like. Memory 304 may comprise any storage means (e.g., devices) suitable for retrievably storing machine-readable instructions executable by the processing unit 302.

The instructions may be implemented in a high level procedural or object oriented programming or scripting language, or a combination thereof, to communicate with or assist in the operation of a computer system, for example the controller 300. Alternatively, the instructions may be implemented in assembly or machine language. The language may be a compiled or interpreted language. Computer-executable instructions may be in many forms, including program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

The controller 300 may be operatively connected to a Global Positioning System (GPS) 306 to receive data indicative of a location of the solar power generators 10, 110, 210 to adjust the orientation of the photovoltaic cell arrays 20, 120, 220 as a function of the location of the solar power generators 10, 110, 210 and of the time of day and of the time of year.

In some embodiments, the instructions are executable by the processing unit 302 for operating one or more solar power generators 10, 110, 210. Operation of one or more solar power generators may comprise obtaining parameters relative to a variation of a position of the sun through a given day and relative to an altitude of the sun during the given day. In some embodiments, obtaining the parameters includes obtaining latitude and longitude coordinates of the solar power generator. The latitude and longitude coordinates of the solar power generator may be obtained, for example, from the GPS 306. Other embodiments may also apply.

The controller 300 is configured to move the casing so that the photovoltaic cell array is oriented substantially perpendicularly relative to solar rays by pivoting the casing about a first axis transverse to the shaft to orient the photovoltaic cell array at the altitude, and rotating the casing about a second axis defined by the shaft to follow the sun from sunrise to sunset. The casing may be displaced via the pivotal and rotational movements through the powertrains 22, 222, 322 of the solar power generators 10, 110, 210.

In some embodiments, the instructions are executable by the processing unit 302 to rotate the casing about the second axis by continuously rotating the casing about the second axis throughout the day. In some embodiments, the instructions are executable by the processing unit to pivot the casing about the first axis by moving the casing relative to the frame. Such instructions may be transmitted to the processing unit 302 via a wireless communication system.

In some embodiments, ends of the shaft are in driving engagement with the frame and the casing is rotatable relative to the shaft. Moving the casing relative to the frame may comprise moving the ends of the shaft relative to the frame by actuating at least one motor secured to the casing and in driving engagement with the shaft.

In some embodiments, rotating the casing about the second axis defined by the shaft comprises limiting rotation of the shaft relative to the frame and actuating at least one motor secured to the casing and in driving engagement with the shaft.

In some embodiments, operation of the solar power generator further comprises converging the solar rays on the photovoltaic cell array, for example with lens 17. In some embodiments, operation of the solar power generator further comprises converging the solar rays on a reflective cone, such as reflective cone 132, within the casing and reflecting the converged solar rays from the reflective cone to the photovoltaic cell array that extends circumferentially around a central axis of the casing.

In a particular embodiment, the solar power generators require a small amount of energy to move the casing to orient the photovoltaic cell arrays normal to the solar rays as the motor(s) have to overcome drag created by the water on the external surface of the casing. This may happen, for instance, when the center of gravity is proximate the shaft. Such a drag is expected to be quite small. The lens may allow to increase the capture surface of the photovoltaic cell array and therefore may increase the efficiency of the generator compared to a configuration lacking a converging lens.

The disclosed solar power generators may allow to leverage aquatic surfaces for solar energy generation. The disclosed solar power generators may offer stability over water, may follow the path of the sun to efficiently intersect solar rays while requiring minimal motor power due to the buoyancy of the casing. Minimal environment impact may be achieved with the transparency and separation of the casings of the generators.

For operating the solar power generators 10, 110, 210, 310, parameters relative to a variation of a position of the sun through a given day and/or relative to an altitude of the sun during the given day are obtained, and the casing is moved to minimize angles between axes normal to photovoltaic cells of the photovoltaic cell array and solar rays impacting the photovoltaic cells by: rotating the casing about a first axis parallel to the shaft to follow an azimuth of the sun; and rotating the casing about a second axis perpendicular to the first axis to follow the altitude of the sun.

In the embodiment shown, the parameters may comprise obtaining latitude and longitude coordinates of the solar power generator. Rotating the casing 16, 216 about the first axis A1 includes continuously rotating the casing 16, 216 about the first axis A1 throughout the day. In the embodiment shown, the shaft 18, 218, 318 is allowed to rotate relative to the frame 12, 212 to drive the pinion gears 28a with the motor 24 via the shaft 18 to rotate the casing 16, 216 about the second axis A2, or rotation of the shaft 18 relative to the frame 12 is limited to rotate the casing 16, 216 about the first axis A1 with the motor 24.

In the present embodiments, the solar rays are converged on the photovoltaic cell array 20, 120, 220. In some embodiments, the solar rays are converged on a reflective cone 132, 232 located inside the casing 16, 216 and reflecting the converged solar rays from the reflective cone 132, 232 to photovoltaic cells 20a of the photovoltaic cell array 20, 120, 220. In some embodiments, power is generated power with a thermoelectric generator 232c in heat exchange relationship with the reflecting cone.

It will be appreciated that any features of any solar generators may be used with other generators. That is, the power train 22 of FIG. 5 may be used with the solar generators of FIG. 7 and FIG. 9. The cell array 120 of FIG. 7 may be used with any of the other generators. Any suitable combination of features of the above described generators may be used without departing from the scope of the present disclosure.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure, and such modifications are intended to fall within the appended claims.

The invention claimed is:

1. A solar power generator comprising:
   a frame securable to an underwater ground surface;
   a shaft supported by the frame;
   a casing floatable on a body of water and movably mounted to the frame via the shaft, the casing rotatable relative to the frame about a first axis defined by the shaft;

a photovoltaic cell array secured to the casing;
a Fresnel lens secured to the casing opposite the photovoltaic cell array to converge solar rays on the photovoltaic cell array;
a reflective cone secured within the casing at a location where the Fresnel lens converges the solar rays, photovoltaic cells of the photovoltaic cell array secured to the casing and circumferentially distributed around a central axis of the cone; and
a motor drivingly engaged to the casing for rotating the casing about the first axis to orient the photovoltaic cell array towards a sun in function of an azimuth of the sun.

2. The solar power generator of claim 1, wherein the casing is pivotable about a second axis transverse to the first axis, the solar power generator comprising a braking device, the shaft rotatable relative to the casing about the first axis and rotatable relative to the frame about the second axis, the motor drivingly engaged to the shaft and secured to the casing, the braking device operable in an engaged position in which rotation of the shaft about the first axis is limited and in which actuation of the motor rotates the casing about the first axis, and in a disengaged position in which the shaft is rotatable relative to the casing about the first axis and in which the actuation of the motor rotates the casing about the second axis.

3. The solar power generator of claim 2, wherein the braking device is a solenoid having a housing and a rod movable relative to the housing from a retracted position corresponding to the disengaged position to an extended position corresponding to the engaged position.

4. The solar power generator of claim 3, wherein the solenoid is secured within the shaft.

5. The solar power generator of claim 2, comprising rack gears secured to the frame, the shaft drivingly engaged to pinion gears meshed with the rack gears, rotation of the shaft about the first axis translating into translation of the pinion gears relative to the rack gears and into rotation of the shaft and of the casing about the second axis, one or more of the frame and the rack gears defining a plurality of apertures circumferentially distributed about the second axis, the braking device engaging any one of the apertures when the braking device is in the engaged position.

6. The solar power generator of claim 1, further comprising a heat sink secured to the casing, the heat sink providing heat exchange relationship between photovoltaic cells of the photovoltaic cell array and an environment outside the casing.

7. The solar power generator of claim 1, wherein the reflective cone has a top portion exposed to the solar rays and a bottom portion in heat exchange relationship with an environment outside the casing, a thermoelectric generator between the top portion and the bottom portion and in heat exchange relationship with the top portion and the bottom portion, the thermoelectric generator electrically connected to the motor.

8. The solar power generator of claim 1, wherein a height of the photovoltaic cell array in a direction parallel to a central axis of the reflective cone is greater than a height of the reflective cone taken along the central axis.

9. The solar power generator of claim 1, comprising a ballast slidingly engaged to the frame, the frame securable to the underwater ground via the ballast, the frame movable relative to the ballast, a second motor secured to the shaft and in driving engagement with a pulley, a cable having both extremities secured to the ballast, the cable wrapped around the pulley, rotation of the pulley by the second motor causing translation of the frame relative to the ballast thereby rotating the casing about a second axis transverse to the first axis to follow an altitude of the sun.

10. A solar power generator comprising:
a frame securable to an underwater ground surface;
a shaft supported by the frame;
a casing floatable on a body of water and movably mounted to the frame via the shaft, the casing rotatable relative to the frame about a first axis defined by the shaft, the casing pivotable about a second axis transverse to the first axis;
a photovoltaic cell array secured within the casing;
a motor drivingly engaged to the casing for rotating the casing about the first axis to orient the photovoltaic cell array towards a sun in function of an azimuth of the sun; and
a braking device, the shaft rotatable relative to the casing about the first axis and rotatable relative to the frame about the second axis, the motor drivingly engaged to the shaft and secured to the casing, the braking device operable in an engaged position in which rotation of the shaft about the first axis is limited and in which actuation of the motor rotates the casing about the first axis, and in a disengaged position in which the shaft is rotatable relative to the casing about the first axis and in which the actuation of the motor rotates the casing about the second axis.

11. The solar power generator of claim 10, wherein;
the motor is secured to and within the casing and in driving engagement with the shaft, the shaft rotatable relative to the casing about the first axis,
pinion gears are drivingly engaged by the shaft and meshed with rack gears secured to the frame, and
the braking device is operable to selectively
allow rotation of the shaft relative to the frame to rotate the pinion gears and to rotate the shaft about the second axis by translating the pinion gears along the rack gears, or
limit rotation of the shaft relative to the frame thereby causing a torque generated by the motor to be transferred to the casing thereby rotating the casing about the first axis.

12. A method of operating a solar power generator having a photovoltaic cell array within a casing floatingly supportable on a body of water and secured to a frame via a shaft, comprising:
obtaining parameters relative to a variation of a position of the sun through a given day and relative to an altitude of the sun during the given day, the obtaining of the parameters includes obtaining latitude and longitude coordinates of the solar power generator; and
moving the casing to minimize angles between axes normal to photovoltaic cells of the photovoltaic cell array and solar rays impacting the photovoltaic cells by:
rotating the casing about a first axis parallel to the shaft to follow an azimuth of the sun; and
rotating the casing about a second axis perpendicular to the first axis to follow the altitude of the sun.

13. The method of claim 12, wherein rotating the casing about the first axis includes continuously rotating the casing about the first axis throughout the day.

14. The method of claim 12, wherein the shaft is in driving engagement with pinion gears, the pinion gears meshed with rack gears secured to the frame, the method comprising:

allowing the shaft to rotate relative to the frame to drive the pinion gears with a motor via the shaft to rotate the casing about the second axis, or limiting rotation of the shaft relative to the frame to rotate the casing about the first axis with the motor.

15. The method of claim 12, further comprising converging the solar rays on the photovoltaic cell array.

16. The method of claim 12, further comprising converging the solar rays on a reflective cone located inside the casing and reflecting the converged solar rays from the reflective cone to photovoltaic cells of the photovoltaic cell array, the photovoltaic cells circumferentially distributed around a central axis of the cone.

17. The method of claim 16, further comprising generating power with a thermoelectric generator in heat exchange relationship with the reflecting cone.

* * * * *